(12) United States Patent  (10) Patent No.: US 8,115,280 B2
Chen et al.  (45) Date of Patent: Feb. 14, 2012

(54) FOUR-TERMINAL GATE-CONTROLLED LVBJTS

(75) Inventors: Chia-Chung Chen, Keelung (TW); Shuo-Mao Chen, Hsin-Chuang (TW); Chin-Wei Kuo, Zhubei (TW); Sally Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/715,071

(22) Filed: Mar. 1, 2010

(65) Prior Publication Data

US 2010/0219504 A1  Sep. 2, 2010

Related U.S. Application Data

(63) Continuation-in-part of application No. 11/589,478, filed on Oct. 30, 2006, now Pat. No. 7,701,038.

(60) Provisional application No. 60/731,720, filed on Oct. 31, 2005, provisional application No. 61/187,796, filed on Jun. 17, 2009.

(51) Int. Cl.
  *H01L 29/735* (2006.01)
  *H01L 29/732* (2006.01)

(52) U.S. Cl. ........ 257/593; 257/197; 257/198; 257/378; 257/557; 257/558; 257/565; 257/578; 257/E29.187; 438/128; 438/170; 438/189; 438/202; 438/203; 438/204; 438/207; 438/234; 438/364; 326/75; 326/124

(58) Field of Classification Search .................. 257/557, 257/558, 593, E29.187
See application file for complete search history.

(56) References Cited

U.S. PATENT DOCUMENTS

| | | | | |
|---|---|---|---|---|
| 3,895,392 | A | * | 7/1975 | Polata et al. ................... 257/565 |
| 3,987,477 | A | * | 10/1976 | Krolik ............................ 257/561 |
| 4,344,081 | A | | 8/1982 | Pao et al. |
| 4,417,265 | A | | 11/1983 | Murkland et al. |
| 4,669,177 | A | | 6/1987 | D'Arrigo et al. |
| 4,672,414 | A | | 6/1987 | Gabriel et al. |
| 4,800,415 | A | | 1/1989 | Simmons et al. |
| 4,831,281 | A | * | 5/1989 | Miller ............................ 327/577 |
| 4,951,108 | A | * | 8/1990 | Leduc ............................ 257/557 |
| 5,416,031 | A | * | 5/1995 | Miwa ............................. 438/236 |
| 5,498,885 | A | | 3/1996 | Deen et al. |
| RE35,442 | E | | 2/1997 | Contiero et al. |
| 5,614,424 | A | * | 3/1997 | Wong et al. ................... 438/335 |

(Continued)

OTHER PUBLICATIONS

Hashimoto, T., et al., "Direction to Improve SiGe BiCMOS Technology Featuring 200-GHz SiGe HBT and 80-nm Gate CMOS," IEEE, IEDM Tech. Dig., 2003, pp. 5.5.1-5.5.4.

(Continued)

*Primary Examiner* — Fernando L Toledo
*Assistant Examiner* — John P Dulka
(74) *Attorney, Agent, or Firm* — Slater & Matsil, L.L.P.

(57) ABSTRACT

An integrated circuit structure includes a well region of a first conductivity type, an emitter of a second conductivity type opposite the first conductivity type over the well region, a collector of the second conductivity type over the well region and substantially encircling the emitter, and a base contact of the first conductivity type over the well region. The base contact is horizontally spaced apart from the emitter by the collector. At least one conductive strip horizontally spaces the emitter, the collector, and the base contact apart from each other. A dielectric layer is directly under, and contacting, the at least one conductive strip.

14 Claims, 12 Drawing Sheets

U.S. PATENT DOCUMENTS

| | | | |
|---|---|---|---|
| 5,717,241 A * | 2/1998 | Malhi et al. | 257/378 |
| 5,717,724 A | 2/1998 | Yamazaki et al. | |
| 6,501,152 B1 | 12/2002 | Johnson | |
| 7,015,089 B2 | 3/2006 | Hsu et al. | |
| 7,173,320 B1 * | 2/2007 | Rahim | 257/557 |
| 7,701,038 B2 * | 4/2010 | Chen et al. | 257/593 |
| 2002/0096713 A1 | 7/2002 | Magnee et al. | |
| 2003/0062539 A1 | 4/2003 | Chatterjee | |
| 2004/0092070 A1 | 5/2004 | Hsu et al. | |
| 2006/0197185 A1 * | 9/2006 | Chung | 257/552 |
| 2008/0224266 A1 * | 9/2008 | Chang et al. | 257/579 |
| 2010/0213575 A1 | 8/2010 | Chen et al. | |

OTHER PUBLICATIONS

Nii, H., "A Novel Lateral Bipolar Transistor with 67 GHz ƒmax on Thin-Film SOI for RF Analog Applications," IEEE Transactions on Electron Devices, Jul. 2000, pp. 1536-1541, vol. 47, No. 7.

Olsson, J., et al., "High Current Gain Hybrid Lateral Bipolar Operation of DMOS Transistors," IEEE Transactions on Electron Devices, IEEE Transactions on Electron Devices, Sep. 1995, pp. 1628-1635, vol. 42, No. 9.

Verdonckt-Vandebroek, S., et al., "High Gain Lateral Bipolar Transistor," IEEE, 1988, 4 pages.

Toumazou, F.J., et al., "Analogue IC Design: The Current-Mode Approach," IEEE Circuits and System Series 2, 1990, 3 pages.

Hastings, A., "The Art of Analog Layout," Prentice Hall, 2001, 6 pages.

Cullet, R., "Multicollector Lateral PNP Transistor," IP.com, Prior Art Database, IPCOM000083560D, Jun. 1, 1975, 3 pages.

Aniruddhan, S., et al., "A lateral-BJT-Biased CMOS Voltage-Controlled Oscillator," IEEE, 2004, pp. 976-979.

Kook, Y.J., et al., "P1.10: A New CMOS Pixel with Lateral and Vertical BJT Structure," IEEE, 2002, pp. 162-165.

Gomez, R., et al., "Lateral Bipolar Transistor Fabricated on a Deep-Submicron Technology," IEEE, 1999, pp. 37-42.

Yamada, T., et al., "A Novel High-Performance Lateral BJT on SOI with Metal-Backed Single-Silicon External Base for Low-Power/Low-Cost RF Applications,": IEEE, 1999, pp. 129-132.

* cited by examiner

FOUR-TERMINAL GATE-CONTROLLED LVBJTS

This application is a continuation-in-part of co-pending U.S. patent application Ser. No. 11/589,478, filed Oct. 30, 2006, and entitled "High-Gain Vertex Lateral Bipolar Junction Transistor," which application claims priority to provisionally filed U.S. Patent Application Ser. No. 60/731,720, filed Oct. 31, 2005, and entitled "A Novel High-Gain Vertex Lateral-BJT," both of which applications are hereby incorporated herein by reference. Further, this application claims priority to provisionally filed U.S. Patent Application Ser. No. 61/187,796, filed Jun. 17, 2009, and entitled "Profile Design for Lateral-Vertical Bipolar Junction Transistor," which application is hereby incorporated herein by reference.

TECHNICAL FIELD

This disclosure relates generally to semiconductor devices, and more particularly to the structures and fabrication methods of lateral-vertical bipolar junction transistors (LVBJTs) formed using complementary metal-oxide-semiconductor (CMOS) silicon-on-insulator (SOI) technology.

BACKGROUND

Figure 1A:
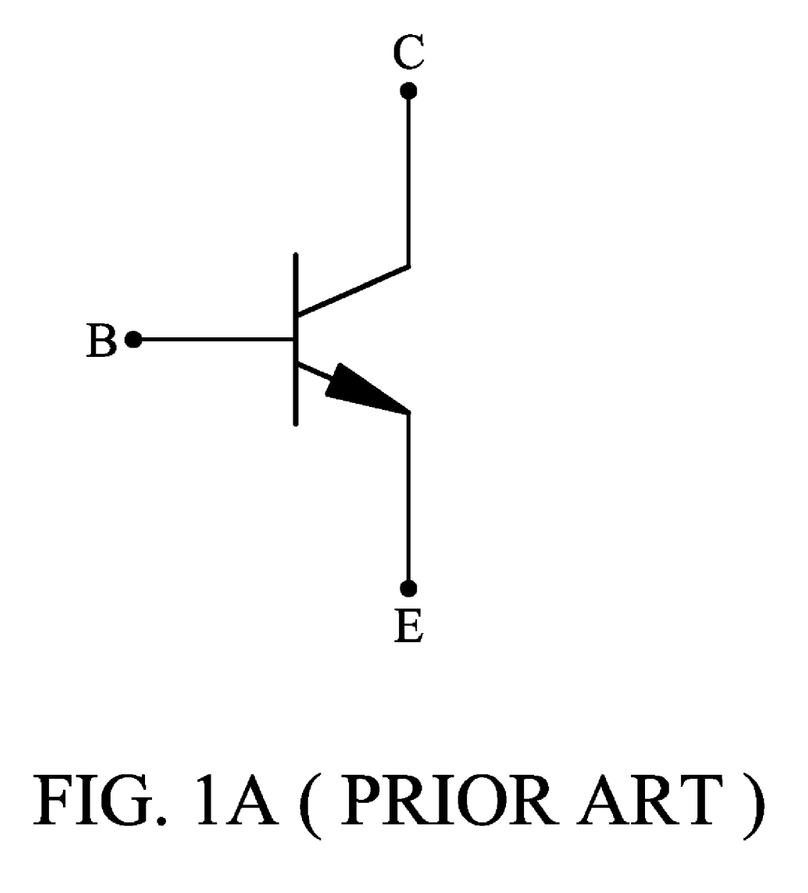
FIG. 1A illustrates a symbol of a bipolar transistor.
Figure 1B:
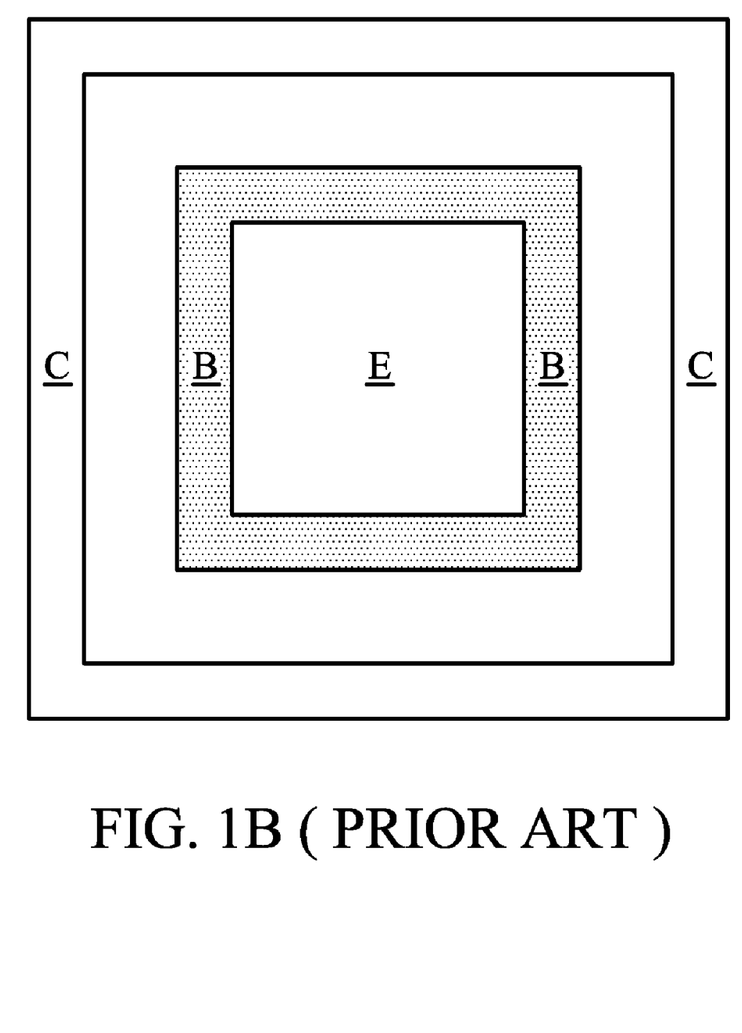
FIGS. 1B and 1C illustrate a top view and a cross-sectional view, respectively, of a conventional vertical bipolar junction transistor (BJT) formed using conventional CMOS technology.
Figure 1C:
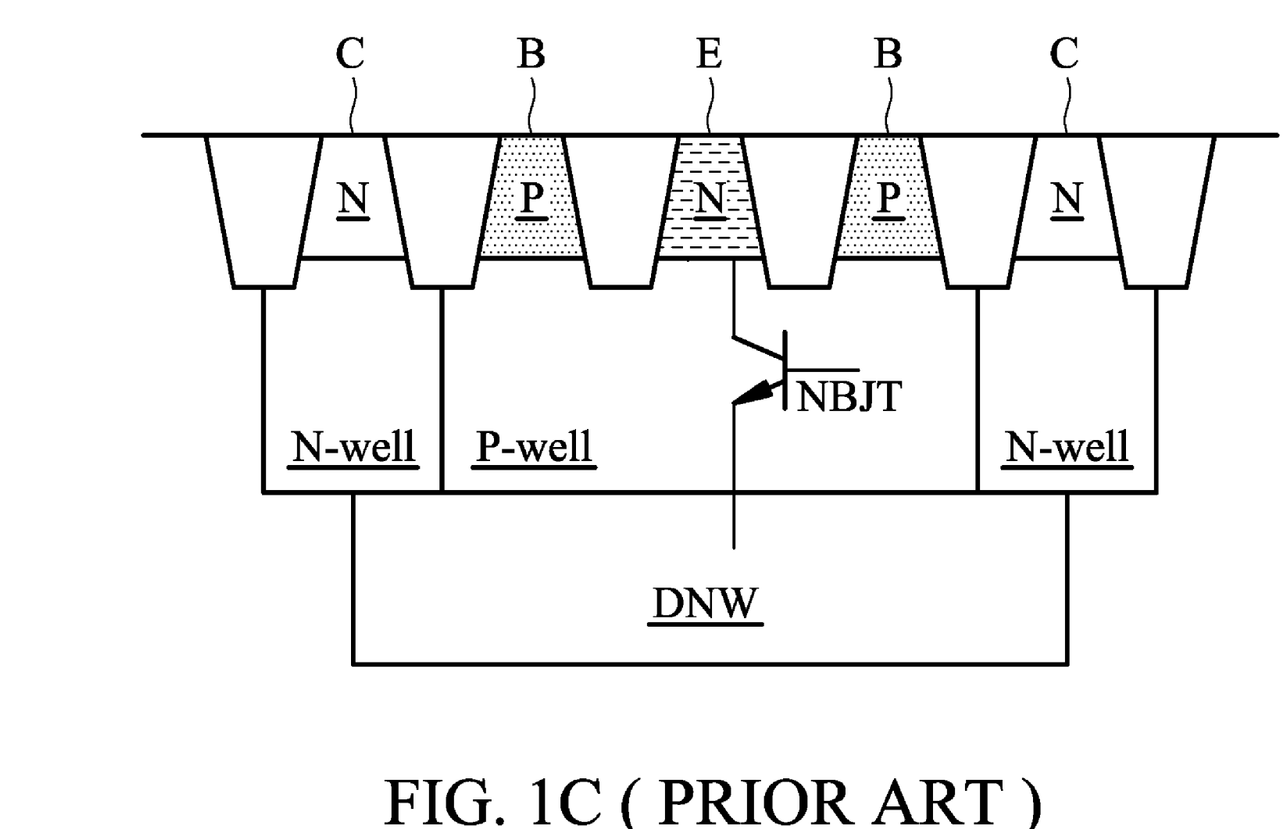

Bipolar junction transistors (BJTs) are key parts of analog integrated circuits. BJTs can be grouped as NPN BJTs (NBJTs) and PNP BJTs (PBJTs). A symbol for an NPN BJT, which comprises collector C, base B, and emitter E, is shown in FIG. 1A. There are two types of commonly designed BJTs that can be formed using conventional CMOS technology. FIGS. 1B and 1C illustrate a vertical-BJT, wherein a top view is shown in FIG. 1B and a cross-sectional view is shown in FIG. 1C. The vertical-BJT is an NPN transistor comprising doped regions, namely emitter E, base contact B and collector C. To enhance emitter injection efficiency, emitter E is encircled by base contact B and collector C. Emitter E and base contact B are formed in a P-well and collector C is formed in an N-well, wherein the P-well and the N-well are further formed on a deep N-well (DNW). Since the base regions include the P-well and base contact B, the emitter/base junction and the collector/base junction are formed between vertically located components, and the respective BJT is referred to as a vertical BJT.

Figure 1D:
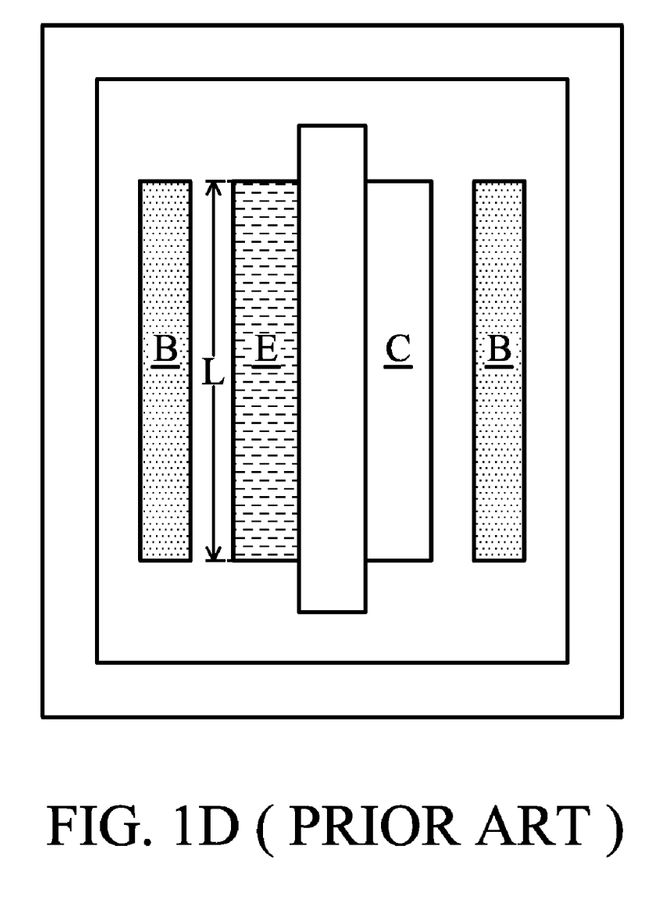
FIGS. 1D and 1E illustrate a top view and a cross-sectional view, respectively, of a conventional lateral bipolar junction transistor (BJT) formed using conventional CMOS technology.
Figure 1E:
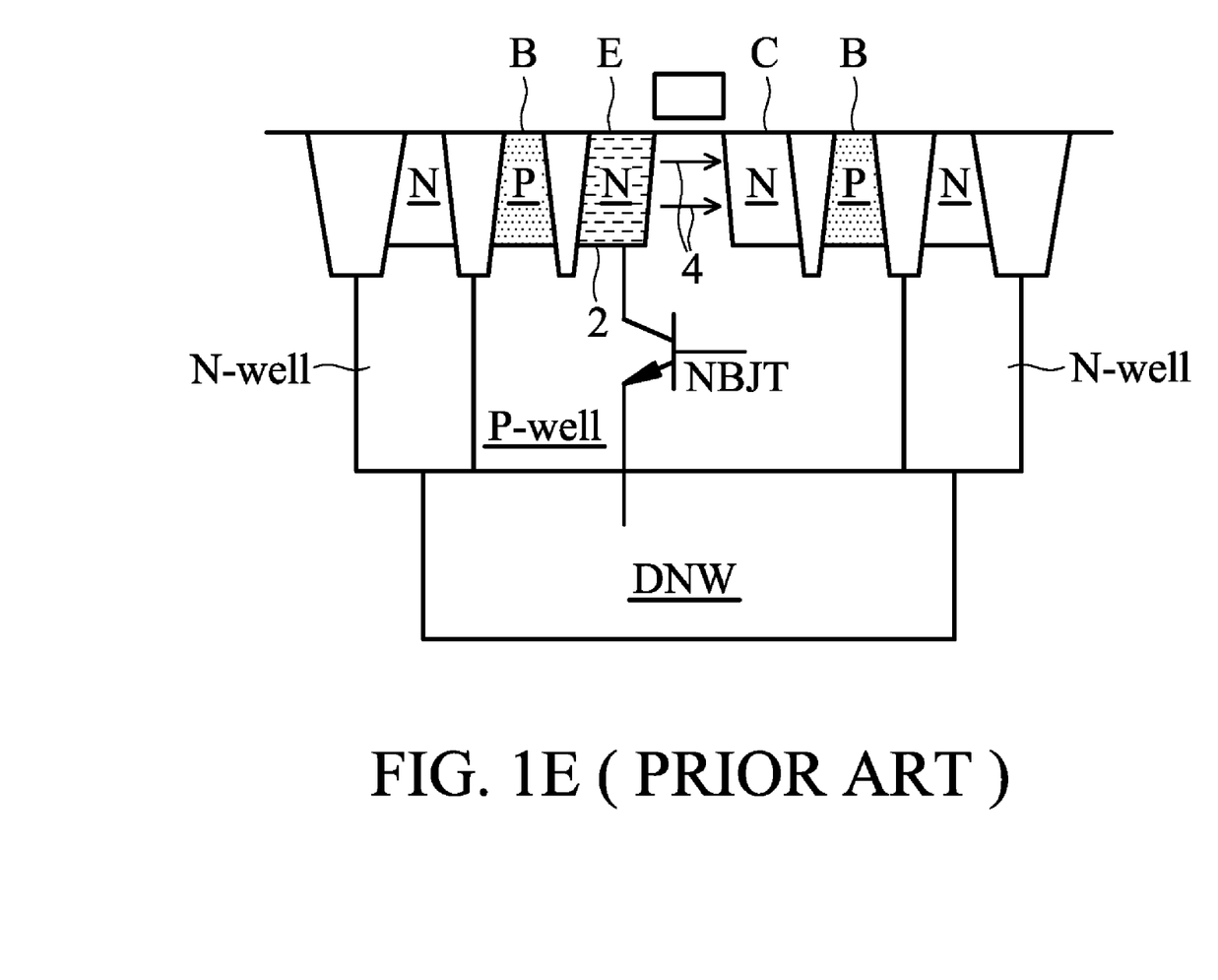

FIGS. 1D and 1E illustrate an (NPN) lateral-BJT. A top view is shown in FIG. 1D and a cross-sectional view is shown in FIG. 1E. Since the P-well, which is part of the base region, has a portion inserted between emitter E and collector C, the emitter/base junction and the collector/base junction are formed between laterally located components, and the respective BJT is referred to as a lateral-BJT (LBJT).

The ability for improving the gain of conventional vertical-BJTs and lateral-BJTs is limited for the following reasons. Using FIG. 1E as an example, besides the intentionally formed BJT, there is also a parasitic transistor NBJT, whose collector, base and emitter are formed by the region E, the P-well and the deep N-well DNW, respectively. Since a significant portion of the emitter/base junction of the parasitic transistor NBJT is located at interface 2, which is located at the bottom of emitter E, and reduces the effect of the parasitic transistor NBJT, it is preferred for interface 2 to have a small area. On the other hand, in order to improve the emitter injection efficiency of the lateral-BJT, it is preferred for the path between emitter E and collector C, which is symbolized by arrows 4, to have a big interface area (in the plane perpendicular to the illustrated plane). This requires the length L (FIG. 1D) of emitter E and collector C to have a great value. A great length L and a small area for emitter E are conflicting requirements, which means that the improvement of the lateral-BJT comes with the cost of a greater parasitic BJT. A dilemma for conventional vertical-BJTs is that the base width, which is substantially equal to a depth of the P-well as shown in FIG. 1C, is not scalable, if the vertical-BJTs are formed using a same technology as the formation of CMOS devices.

SUMMARY

In accordance with one aspect, an integrated circuit structure includes a well region of a first conductivity type, an emitter of a second conductivity type opposite the first conductivity type over the well region, a collector of the second conductivity type over the well region and substantially encircling the emitter, and a base contact of the first conductivity type over the well region. The base contact is horizontally spaced apart from the emitter by the collector. At least one conductive strip horizontally spaces the emitter, the collector, and the base contact apart from each other. A dielectric layer is directly under, and contacting, the at least one conductive strip.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel design of lateral-vertical bipolar junction transistors (LVBJTs) having improved current gain is provided in accordance with an embodiment. The variations of the embodiment are discussed. Throughout the various views and illustrative embodiments, like reference numbers are used to designate like elements.

Figure 2A:
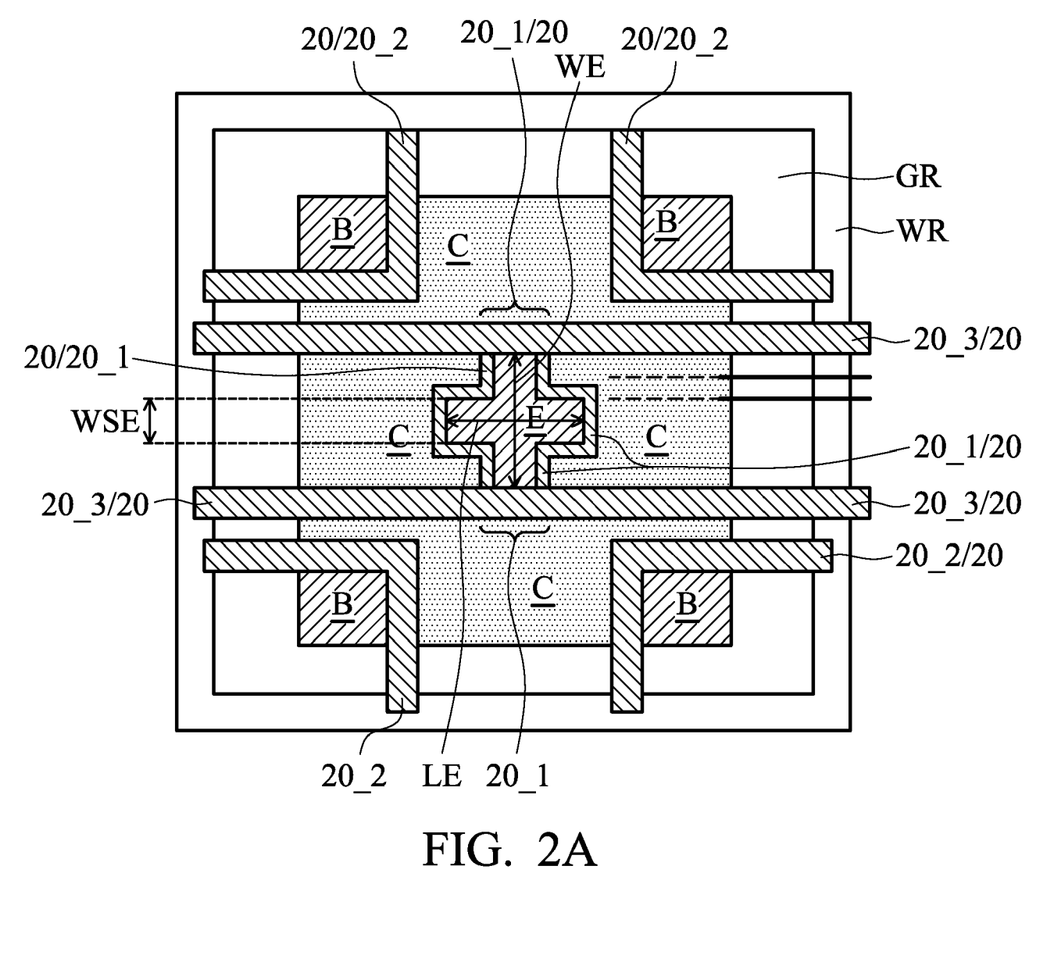
FIGS. 2A through 2D illustrate top views of BJT cells in accordance with embodiments.
Figure 2B:
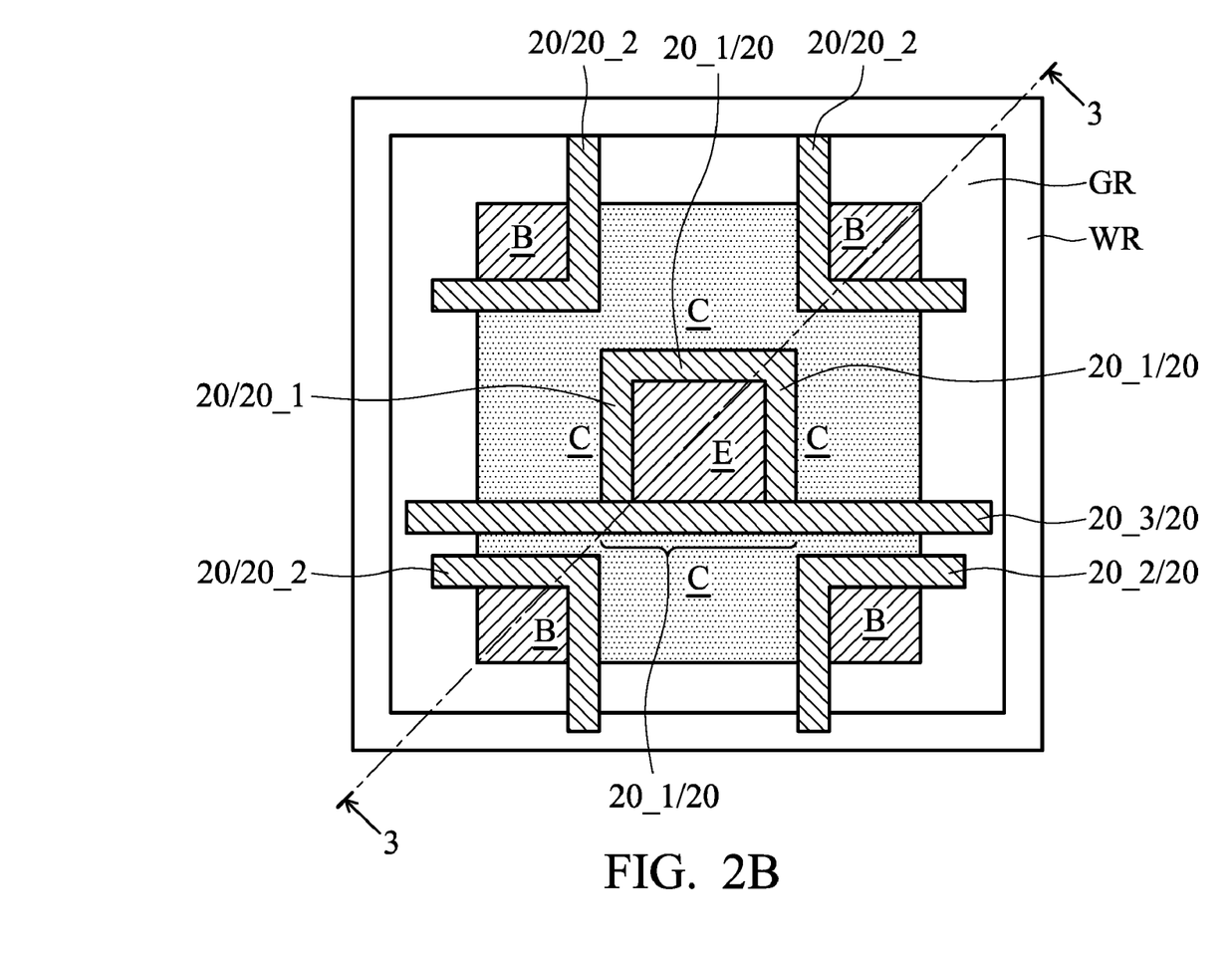

A top view of an NPN BJT (NBJT) cell in accordance with an embodiment is shown in FIG. 2A, which includes collectors C, base contacts B, and emitter E at the center (also referred to as a vertex) of the BJT cell. FIG. 2B illustrates an alternative embodiment, with the patterns of emitter E modified. Emitter(s) E are located at the vertex of collectors C. To improve the performance of the BJT, the area of emitter E is preferably small, and may be achieved by reducing length LE and width WE of emitter E. Collectors C may be formed neighboring each and every side of emitter E. In an embodiment, no base contact B is formed neighboring any side of the emitter E without one of collectors C therebetween. All collectors C are interconnected and act as a single collector, and all base contacts B are interconnected and act as a single base contact. Accordingly, the BJT cell as shown in FIG. 2A acts as a single BJT.

Assuming the total length of the parameter of emitter E is represented as length LPE (not shown in Figures), a ratio of the total length LPE to the area AE of emitter E may be indicated as a parameter-to-area ratio. In FIG. 2A, length LPE equals the total length of the 12 sections of the boundary of emitter E. It was found that a high parameter-to-area ratio is beneficial to the performance of the resulting BJT. Furthermore, a high LPE value is beneficial for improving the emitter injection efficiency, while a small area is beneficial for reducing the effect of undesirable parasitic BJT. With a high parameter-to-area ratio, since all the sides of emitter E are adjacent collectors C, the path between emitter E and collectors C are relatively wide, and hence the performance of the resulting BJT is improved. To increase the parameter-to-area ratio, as shown in FIG. 2A, emitter E may adopt a shape of a cross, which has a high parameter-to-area ratio, although any other shape that has a high parameter-to-area ratio may also be used. For example, emitter E may include a plurality of interconnected narrow strips. The width of each narrow emitter strip (for example, width WSE in FIG. 2A) may be close to or equal to the minimum width allowed by the forming technology of the integrated circuit, or in other words, close to the critical dimension. Alternatively, emitter E may have the shape of a polygon, such as triangle, rectangle (as shown in FIG. 2B), or hexagon.

All the junctions of emitter E to collector C, emitter E to base B, and base B to collector C may be horizontally spaced apart from each other (when viewed from top) by forming conductive strips 20 (which may be formed of polysilicon and hence may alternatively be referred to as polysilicon strips hereinafter). Alternatively, conductive strips 20 may be formed of other conductive material, such as metals. Referring to FIGS. 2A and 2B, conductive strips 20 (including 20_1, 20_2, and 20_3) are formed to horizontally space each of emitter E, collectors C, and base contacts B from others. Further, the horizontal distance between emitter E and base contacts B may be greater than the width (such as LG, not shown) of conductive strips 20. In other words, each of base contacts B may be laterally separated from emitter E by at least one (and possibly two or more) of conductive strips 20 and at least one of collectors C.

Figure 3:
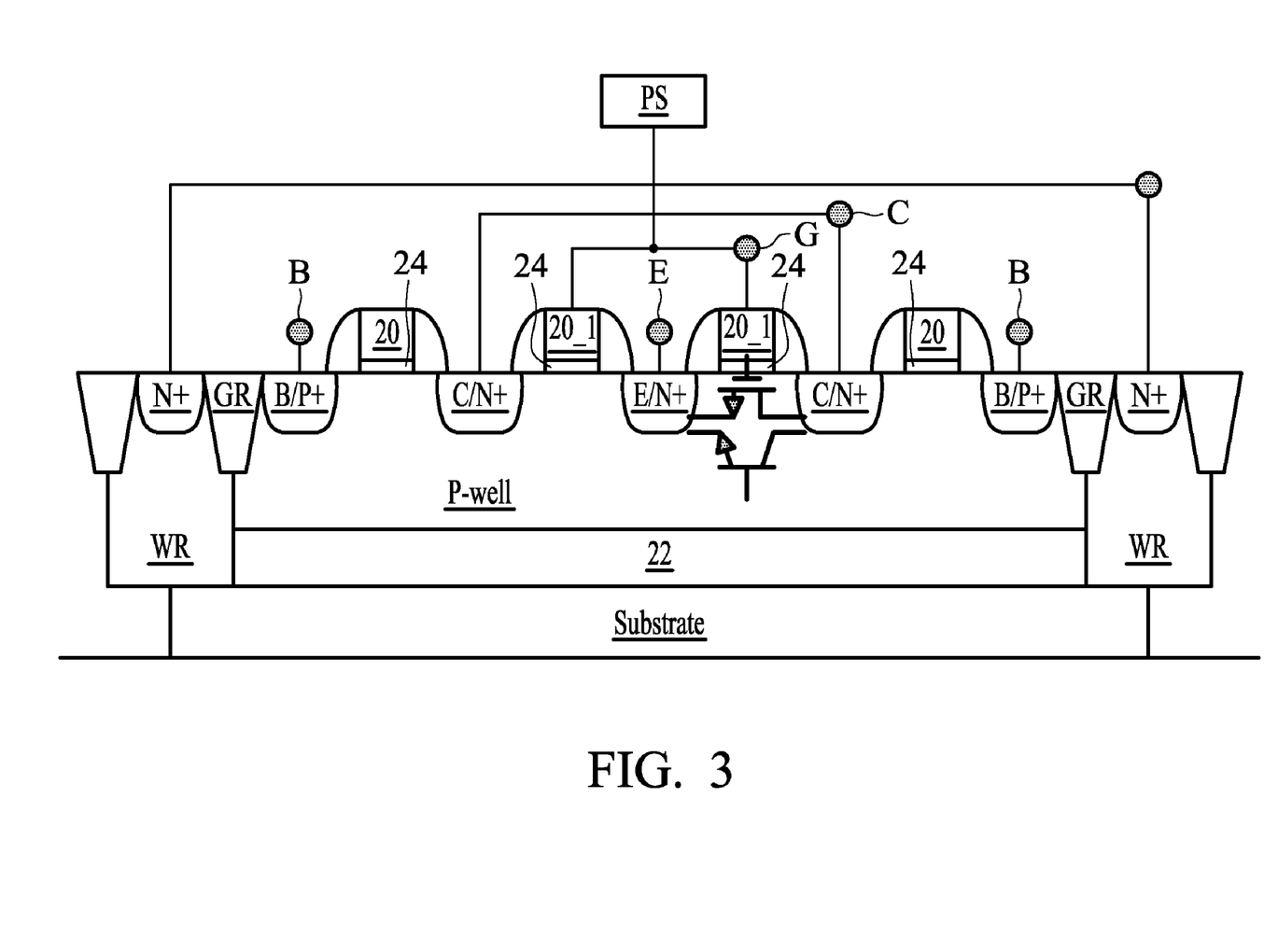
FIGS. 3 and 4 illustrate cross-sectional views of BJT cells.

A cross-sectional view of the BJT, as shown in FIG. 2B, is illustrated in FIG. 3, wherein the cross-sectional view is taken along a line 3-3 in FIG. 2B. From the cross-sectional view, it is observed that emitter E, collectors C and base contacts B are formed in and contacting a P-well, which is further located on a buried oxide (BOX) 22. BOX 22 may further be located on a substrate formed of a semiconductor material, such as silicon. The substrate may be of p-type, although it can also be of n-type. Throughout the description, base contacts B are equally referred to as bases B, although the base region includes both base contact B and the underlying P-well region.

Conductive strips 20, which are further located on dielectric layer 24, laterally separate collectors C, base contacts B, and emitter E from each other. Accordingly, emitter E, conductive strip(s) 20_1 (which act(s) as a gate), and the surrounding collector(s) C may form a metal-oxide-semiconductor (MOS) device(s), as symbolized in FIG. 3. Conductive strips 20 may be doped and a bias voltage can be applied thereon to reduce a leakage of the resulting BJT. In an embodiment, power supply source PS is connected to conductive strips 20_1 to apply the bias voltage. The bias voltage may be a negative voltage, for example, equal to about −0.25V, although different voltages may be applied.

Alternatively, instead of forming conductive strips 20 and oxide layer 24, resist protective oxide (RPO) strips may be formed. Although the RPO strips cannot be used for applying bias voltages, they may be used for isolating the subsequently formed silicide regions on emitter E, collectors C, and base contacts B from contacting each other.

As shown in FIG. 3, the BJT may further include guard ring GR, which may be formed of a shallow trench isolation (STI) region that encircles the P-well. Further, for the NBJT, an n-well ring WR (also refer to FIG. 2) is formed, also in the form of a ring encircling guard ring GR. In an embodiment, when the BJT is used, well ring WR may not be applied with any bias voltage.

The BJT in accordance with the embodiment may be formed using CMOS processes, with the N+ regions, P+ regions, P-well region, and N-well region (such as WR) formed simultaneously with the formation of CMOS devices, such as logic devices. Accordingly, the illustrated N+ regions, P+ regions, P-well region, and N-well region may be formed using implantations. Further, BOX region 22 may be formed by implanting oxygen into the desired depth in the substrate, and then performing an annealing in an oxygen-free environment, so that the implanted oxygen forms silicon oxide with the neighboring silicon. Alternatively, a silicon-on-insulator (SOI) substrate may be used. The formation process of the BJT may be fully compatible with the CMOS processes.

Figure 4:
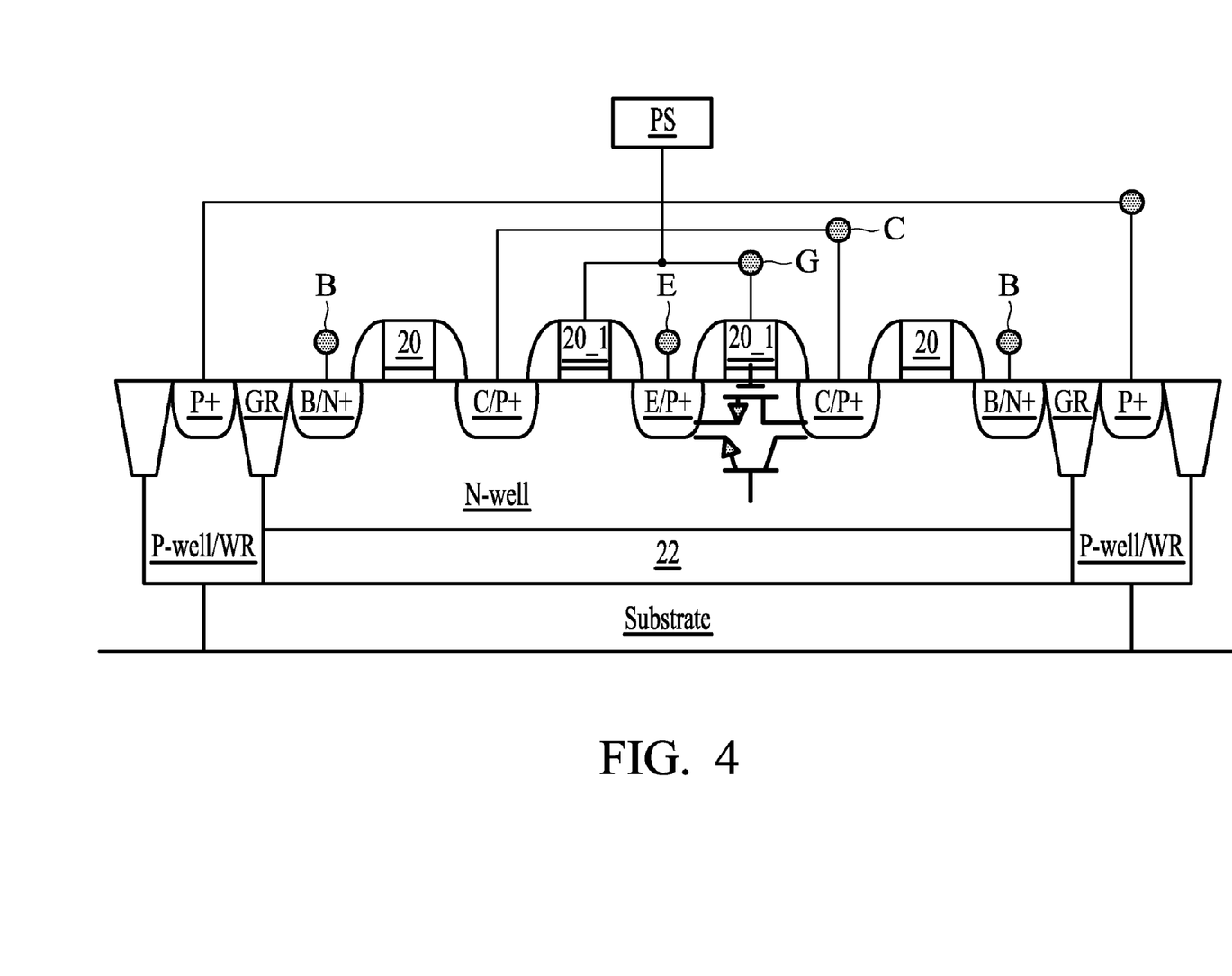

FIG. 4 illustrates a cross-sectional view of a PNP LBJT, which is similar to the structure shown in FIG. 3, except the conductivity types of collectors C, emitter E, and base contacts B are reversed, and the conductivity types of the well regions may also be reversed. The top views of the PNP LBJT may also be essentially the same as in FIGS. 2A through 2D. Again, BOX region 22 is formed to isolate the PNP LBJT from the underlying substrate, which may be either of p-type or of n-type. To reduce leakage currents, bias voltage source PS may apply a positive bias voltage to conductive strips 20_1.

Figure 2C:
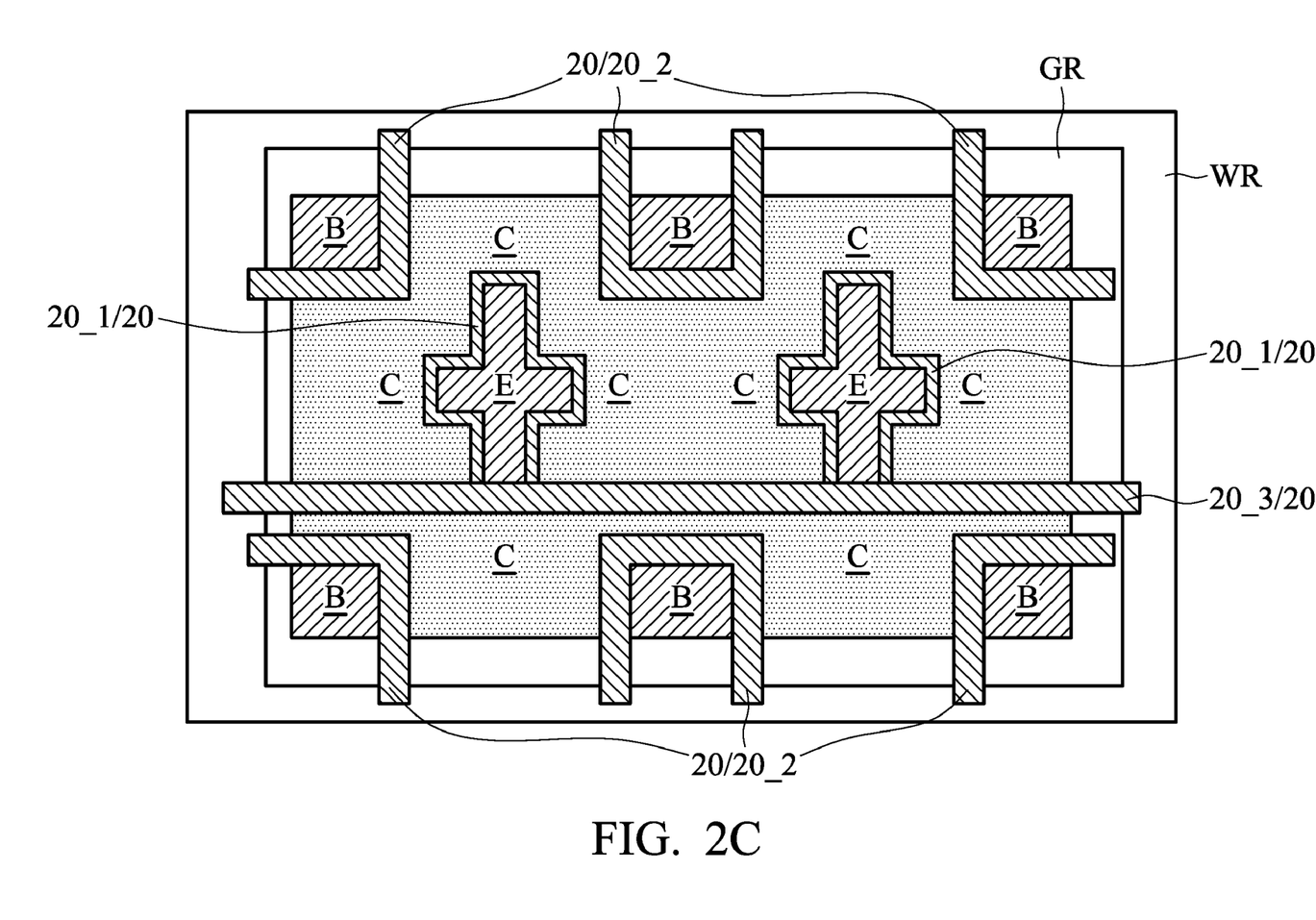
Figure 2D:
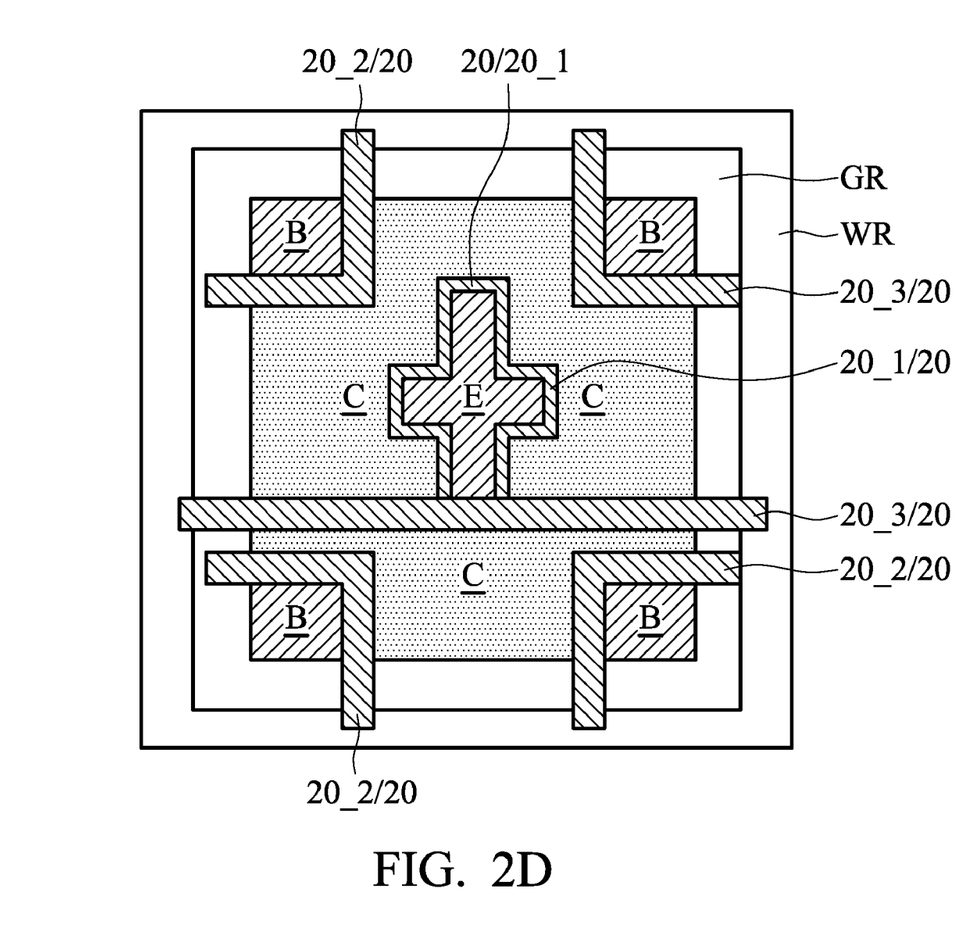

FIGS. 2C and 2D are variations of the embodiment. It is noted that a LBJT may include a plurality of emitters isolated from each other by conductive strips 20 and collectors C. For example, in FIG. 2C, two emitters E are formed and are interconnected to act as a single emitter. More emitters E may be added and may be arranged in a periodic pattern, such as an array. FIG. 2D is similar to FIG. 2A, except only one conductive strip 20_3 is formed. Again, in these embodiments, all borders of emitter(s) E are encircled by conductive strips 20 and neighboring collectors C, and no base contact B is adjacent the borders of any emitter E without a collector C therebetween. It is appreciated that although emitters E, collectors C, and base contacts B are illustrated as having regular shapes for the convenience of layout, they can have irregular shapes, and the irregularity includes sides with unequal lengths, curved sides, etc.

Figure 5:
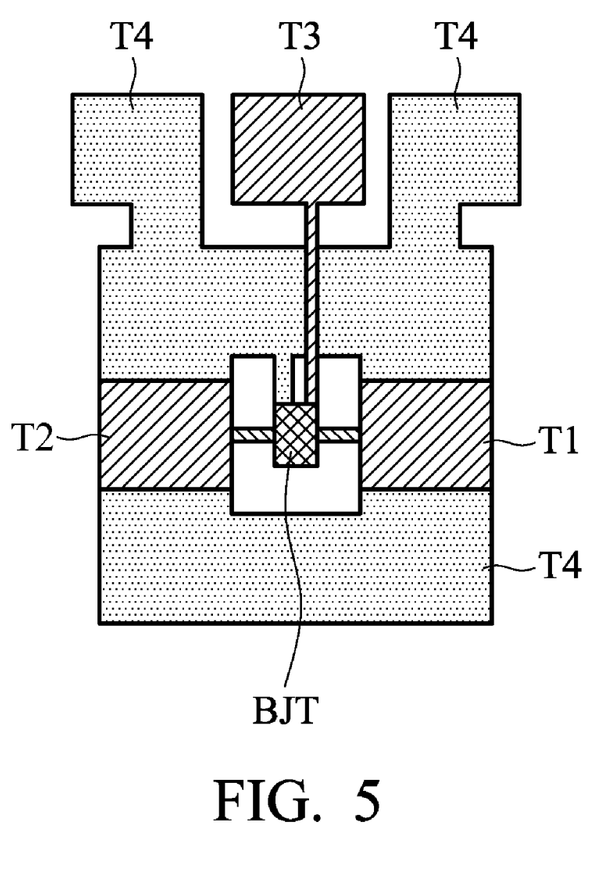
FIG. 5 illustrates a test device for testing the BJT cells.

FIG. 5 illustrates a test structure, wherein the illustrated BJT embodiment represents the LBJT (as shown in FIGS. 2A through 4) to be tested. Four terminals are needed to test the LBJT, including terminals T1, T2, T3, and T4, which are connected to well region WR, base contacts B, conductive strips 20_2, and emitter(s) E (not shown in FIG. 5, please refer to FIGS. 2A-4), respectively. The radio frequency response of the tested LBJT is measured from base contacts B and the N-well WR (FIG. 3), which act as RF port 1 and RF port 2 (not shown), respectively. The experiment result revealed that frequencies Ft and Fmax, at which the H21 gain and the unilateral power gain, respectively, are degraded to 1, are high. Further, the LBJT cells in accordance with the embodiments have high current gains. This may be caused by the isolation of the substrate from the overlying well regions due to the existence of BOX 22, which results in the elimination of the parasitic BJTs resulted from the substrate.

It is noted that although in the above-discussed embodiments, the formation of LVBJTs are used as an example, the CMOS SOI technology, for example, adopting BOX 22 as shown in FIGS. 3 and 4, may be used in other devices, such as radio frequency (RF) devices, active devices, such as RFMOS, and passive devices, such as inductors, varactors, filters, antennas, and the like, so that the substrate loss can be reduced, and the inherent parasitic RLC for RF applications may be reduced.

It was observed that besides the high RF frequencies and high current gain, the isolation between the LBJT and the substrate (p-sub, for example) also results in the reduction in the flicker noise. Further, the manufacturing process of the embodiments may be fully compatibility with the CMOS SOI process, and hence the manufacturing costs may be reduced.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
a semiconductor substrate;
a guard ring formed of a shallow trench isolation region extending into the semiconductor substrate;
a well region of a first conductivity type encircled by the guard ring, wherein the well region forms a polygon;
an emitter of a second conductivity type opposite the first conductivity type over the well region;
at least one collector of the second conductivity type over the well region and substantially encircling the emitter;
a plurality of base contacts of the first conductivity type over the well region, wherein the plurality of base contacts is spaced apart from each other by the at least one collector, wherein each of the plurality of base contacts is located at one corner of the polygon, and wherein no base contact extends from one corner of the polygon to another corner of the polygon;
at least one conductive strip horizontally spacing the emitter, the at least one collector, and the plurality of base contacts apart from each other; and
a dielectric layer directly under, and contacting, the at least one conductive strip.

2. The integrated circuit structure of claim 1 further comprising
a buried oxide region directly underlying the well region and over the semiconductor substrate.

3. The integrated circuit structure of claim 1 further comprising at least one additional emitter of the second conductivity type and over the well region, wherein each of the at least one additional emitter is horizontally spaced apart from the emitter and the collector by at least two conductive strips, and wherein the at least one additional emitter is electrically connected to the emitter.

4. The integrated circuit structure of claim 1 further comprising a bias voltage source electrically coupled to the at least one conductive strip, wherein the bias voltage source is configured to provide a negative bias voltage.

5. The integrated circuit structure of claim 1 further comprising an additional well region forming a ring encircling the well region, with the additional well region being of the second conductivity type.

6. The integrated circuit structure of claim 1, wherein the emitter has a shape of a cross in a top view.

7. The integrated circuit structure of claim 1, wherein each of the plurality of base contacts is in contact with two inner sidewalls of the guard ring, and wherein the two inner sidewalls that contact a same base contact join each other.

8. The integrated circuit structure of claim 1, wherein each of corners of the polygon has one of the plurality of base contacts formed thereon, and none of the plurality of base contacts joins any other one of the plurality of base contacts.

9. The integrated circuit structure of claim 1, wherein the at least one collector forms a full ring encircling the emitter, with no break in the full ring.

10. The integrated circuit structure of claim 9, wherein the at least one conductive strip comprises a first portion forming a full ring encircling the emitter, and a second portion extending from the full ring to over the guard ring.

11. The integrated circuit structure of claim 1, wherein each of the at least one collector comprises a first edge aligned to an edge of one of the at least one conductive strip, and a second edge contacting the guard ring.

12. The integrated circuit structure of claim 1 further comprising an additional emitter over the well region, wherein the additional emitter does not contact the guard ring.

13. The integrated circuit structure of claim 1, wherein the guard ring does not enclose any base contact that is not in contact with the guard ring.

14. The integrated circuit structure of claim 1, wherein the polygon is a rectangle, and wherein the plurality of base contacts comprises four disconnected base contacts on four corners of the rectangle.

* * * * *